(12) United States Patent
Lee

(10) Patent No.: US 6,355,533 B2
(45) Date of Patent: Mar. 12, 2002

(54) METHOD FOR MANUFACTURING SEMICONDUCTOR DEVICE

(75) Inventor: Jung-Ho Lee, Kyoungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/739,499

(22) Filed: Dec. 20, 2000

(30) Foreign Application Priority Data

Dec. 24, 1999 (KR) .............................................. 99-61869

(51) Int. Cl.⁷ .............................................. H01L 21/331
(52) U.S. Cl. ........................................ 438/366; 438/229
(58) Field of Search ............................... 438/229–233, 438/299–307, 364–368, 554, 558, 559

(56) References Cited

U.S. PATENT DOCUMENTS 5,118,639 A  *  6/1992  Roth et al. ..................... 437/41
5,960,319 A  *  9/1999  Iwata et al. ................. 438/664

* cited by examiner

Primary Examiner—David Nelms
Assistant Examiner—David Vu
(74) Attorney, Agent, or Firm—Finnegan, Henderson, Farabow, Garrett & Dunner, L.L.P.

(57) ABSTRACT

A method for manufacturing a semiconductor device includes the steps of preparing a semiconductor substrate provided with a cell area and a peripheral area, forming gate structures, forming a first side wall spacer on a side of each gate structure, growing up a single crystal silicon layer formed on an exposed portion of the semiconductor substrate by using a selective epitaxial growth method, forming a second and a third patterned insulating layers in the cell area and forming a second and a third side wall spacers in the peripheral area, carrying out an ion implantation to semiconductor substrate in the peripheral area, removing the third patterned insulating layer and the third side wall spacer, forming an interlayer insulating layer on the semiconductor substrate and the gate structures, patterning the interlayer insulating layer into a second predetermined configuration, whereby the interlayer insulating layer does not remain in the cell area and the second patterned insulating layer is patterned into a side wall pattern, forming a conductive layer on the cell area and the peripheral area, and planarizing a surface of the conductive layer, thereby obtaining a contact plug in the cell area.

19 Claims, 6 Drawing Sheets

METHOD FOR MANUFACTURING SEMICONDUCTOR DEVICE

FIELD OF THE INVENTION

The present invention relates to a semiconductor device; and, more particularly, to a method for manufacturing the semiconductor device incorporated therein a contact region with uniformity by using a selective epitaxial growth of a single crystal silicon.

DESCRIPTION OF THE PRIOR ART

Generally, in a P-N contact semiconductor device, a diffusion region is achieved by annealing after implanting impurity ions into a semiconductor substrate. In order to prevent a short channel effect due to a side diffusion of the diffusion region in a semiconductor device with a narrow channel space, a depth of the diffusion region should be shallow.

Referring to FIGS. 1A to 1F, there are provided cross sectional views setting forth a conventional method for manufacturing a semiconductor device using an enlarged margin self aligned contact (EMSAC).

The manufacturing steps begin with a preparation of a semiconductor substrate 110 incorporating therein isolation regions 112, wherein a reference numeral 160, 180 denote a cell area and a peripheral circuit area, respectively. Thereafter, an gate oxide layer, a gate electrode layer and a mask layer are formed on the semiconductor substrate 110, subsequently, and then they are patterned into a first predetermined configuration, thereby obtaining two gate structures provided with gate dielectrics 114, gate electrodes 116 and mask patterns 118 as shown in FIG. 1A. Here, one gate structure is disposed on the cell area 160 and the other one is disposed on the peripheral area 180.

In a next step as shown in FIG. 1B, impurity ions 145 are implanted into the semiconductor substrate in the cell area 160, thereby obtaining a shallow contact region 122. And then, first side wall spacers 120 are formed on sides of the gate structures.

In an ensuing step, a second insulating layer and a third insulating layer are formed on the semiconductor substrate 110 and the gate structures. And next, the second and the third insulating layers are patterned into a second predetermined configuration using a mask in the cell area 160, whereby a second patterned insulating layer 124A and a third patterned insulating layer 126A are formed in the cell area 160 and a second side wall spacer 124B and a third side wall spacer 126B are formed in the peripheral area 180. Thereafter, the impurity ions are implanted into the semiconductor substrate in the peripheral area 180, thereby obtaining a deep contact region 128 as shown in FIG. 1C.

In a subsequent step, the third patterned insulating layer 126A and the third side wall spacer 126B are removed by a wet etching method using fluoric acid. Then, an interlayer insulating layer 130 is formed on entire surface and flattened by using a chemical mechanical polishing (CMP) technique.

Thereafter, the interlayer insulating layer 130 is selectively etched into a third predetermined configuration using a mask, whereby the interlayer insulating layer 130 in the cell area 160 are removed and the second patterned insulating layer 124A is patterned into a side wall pattern 124A' as shown in FIG. 1E.

Finally, a conductive layer is deposited on entire surface and flattened by the CMP technique until a height of the conductive layer in the cell area 160 is identical to that of the interlayer insulating layer 130A in the peripheral area 180. Thus, a contact plug 132 is obtained as shown in FIG. 1F.

The conventional method as described above using the EMSAC process has a drawback that total manufacturing steps are too complicated. And further, it takes a long time to adjust uniformity of the surface height delicately when employing the CMP process. Additionally, the shallow contact region to prevent the short channel effect, may be deteriorated due to a loss of the semiconductor substrate.

SUMMARY OF THE INVENTION

It is, therefore, an object of the present invention to provide a semiconductor device incorporating therein a shallow contact region in a cell area and a deep contact region in a peripheral area by using a selective epitaxial growth of a single crystal silicon layer, thereby enhancing a contact margin in the cell area and obtaining the deep contact region with a uniform depth in the peripheral region.

In accordance with one aspect of the present invention, there is provided a method for manufacturing a semiconductor device for use in a memory cell, the method comprising the steps of: a) preparing a semiconductor substrate provided with a cell area and a peripheral area; b) forming gate structures formed on the semiconductor substrate which one is disposed in the cell are and the other is disposed in the peripheral area, wherein the gate structures includes gate dielectrics, gate electrodes and mask patterns; c) forming a first side wall spacer on a side of each gate structure; d) growing up a single crystal silicon layer formed on an exposed portion of the semiconductor substrate by using a selective epitaxial growth method; e) forming a second and a third insulating layers on the substrate and the gate structures and patterning into a first predetermined configuration, thereby forming a second and a third patterned insulating layers in the cell area and forming a second and a third side wall spacers in the peripheral area; d) carrying out an ion implantation to semiconductor substrate in the peripheral area; e) removing the third patterned insulating layer and the third side wall spacer; f) forming an interlayer insulating layer on the semiconductor substrate and the gate structures; g) patterning the interlayer insulating layer into a second predetermined configuration, whereby the interlayer insulating layer does not remain in the cell area and the second patterned insulating layer is patterned into a side wall pattern; h) forming a conductive layer on the cell area and the peripheral area; and i) planarizing a surface of the conductive layer, thereby obtaining a contact plug in the cell area.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

There are provided in FIGS. 2A to 2F cross sectional views setting forth a method for manufacturing a semiconductor memory device in accordance with a preferred embodiment of the present invention.

Figure 1A:
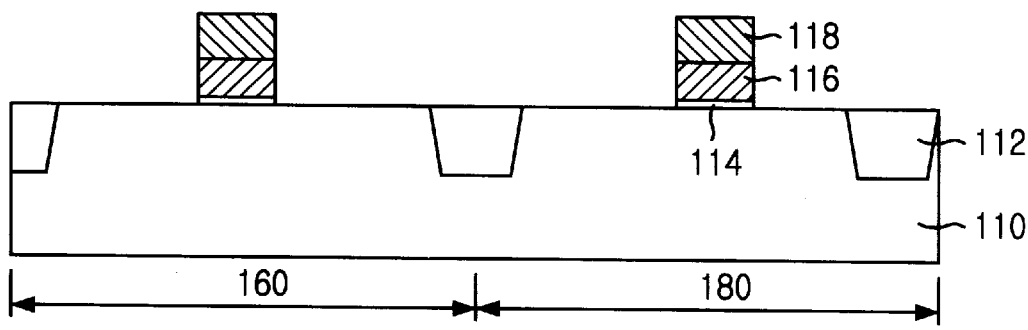
FIGS. 1A, 1B, 1C, 1D, 1E and 1F are schematic cross sectional views setting forth a conventional method for manufacturing a semiconductor device.
Figure 1B:
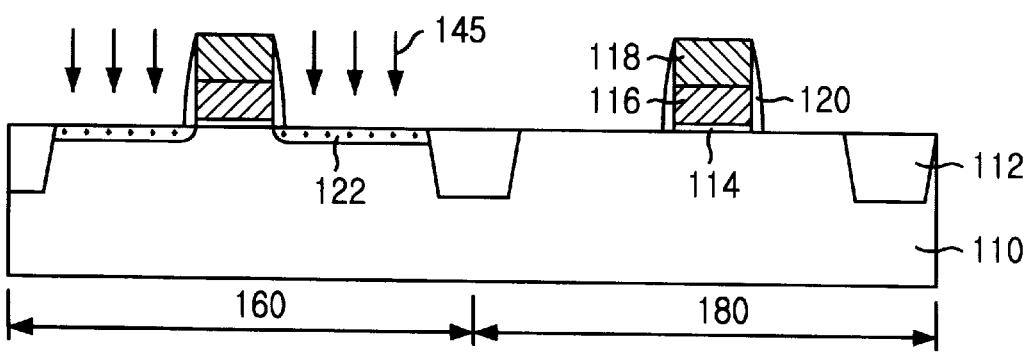
Figure 1C:
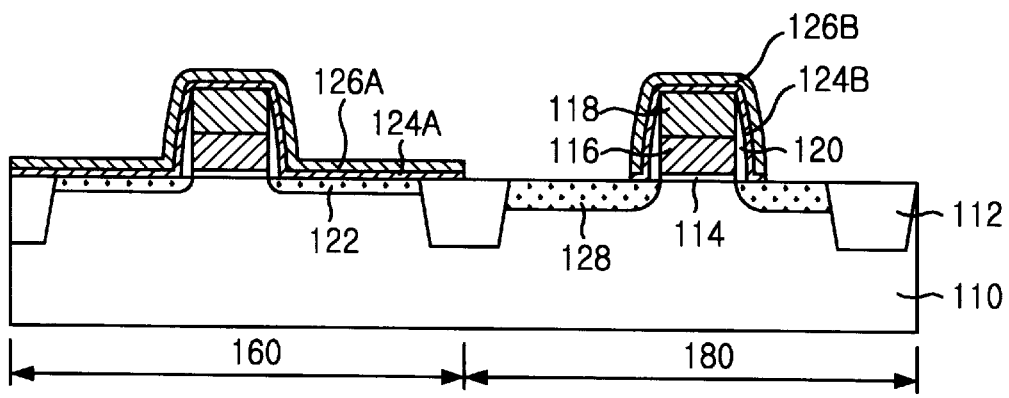
Figure 1D:
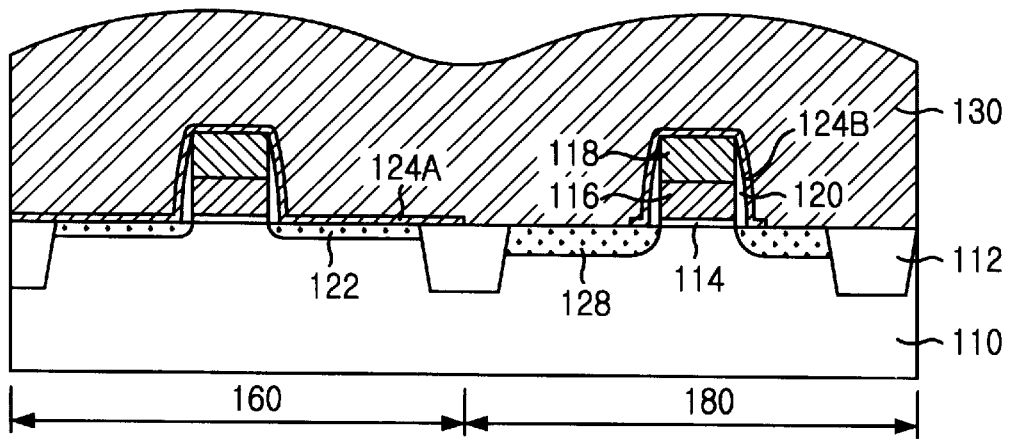
Figure 1E:
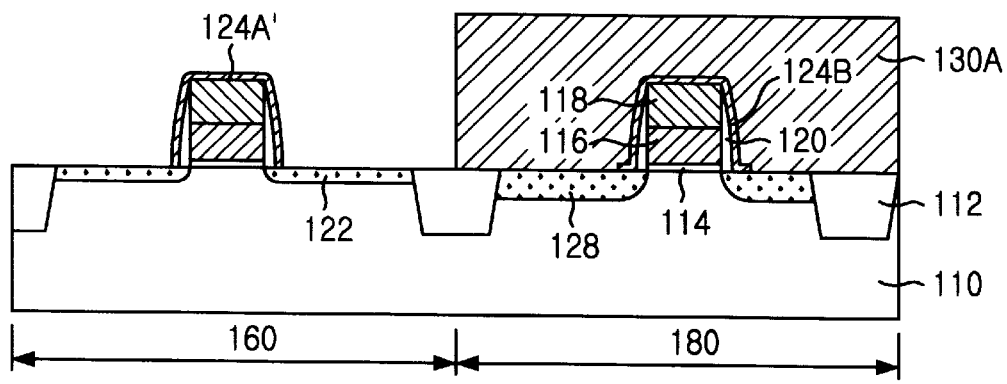
Figure 1F:
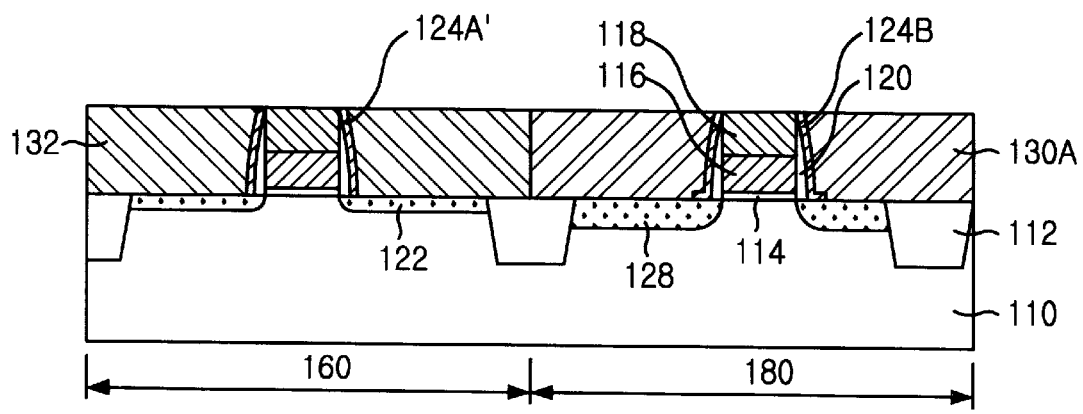
Figure 2A:
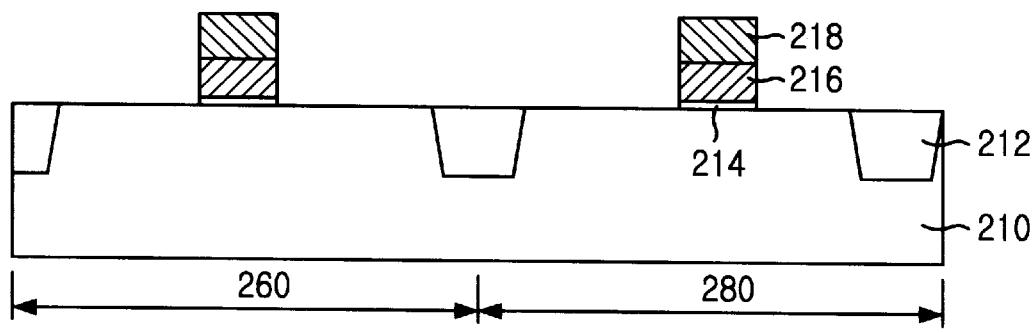
FIGS. 2A, 2B, 2C, 2D, 2E and 2F are schematic cross sectional views setting forth a method for manufacturing a semiconductor device in accordance with a preferred embodiment of the present invention.
Figure 2B:
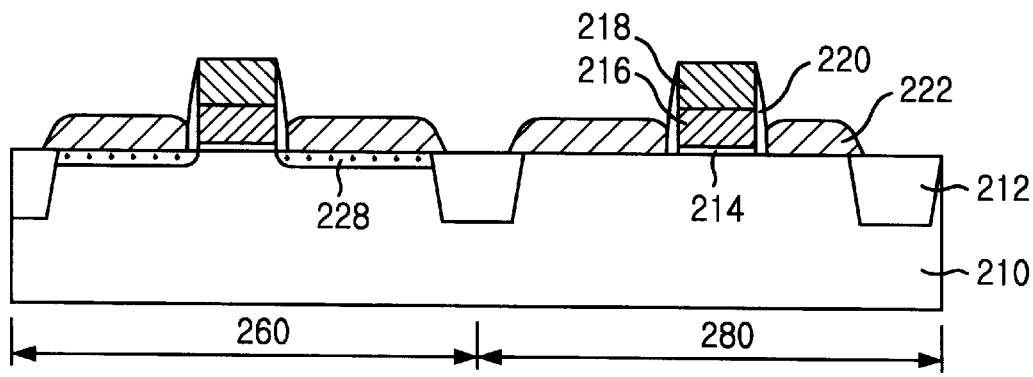

The manufacturing steps begin with a preparation of a semiconductor substrate 210 incorporating therein isolation regions 212, wherein reference numerals 260, 280 denote a cell area and a peripheral circuit area, respectively. Thereafter, an gate oxide layer, a gate electrode layer and a mask layer are formed on the semiconductor substrate 210, subsequently, and then they are patterned into a first predetermined configuration, thereby obtaining two gate structures provided with gate dielectrics 214, gate electrodes 216 and mask patterns 218 as shown in FIG. 2A. The mask layer is formed to a thickness ranging from approximately 1,000 Å to approximately 2,000 Å using a plasma enhanced nitride. Here, one gate structure is disposed on the cell area 260 and the other one is disposed on the peripheral area 280.

In a next step, a first insulating layer (not shown) is formed to a thickness in the range of 200 Å to 500 Å and patterned into a first predetermined configuration, thereby obtaining first side wall spacers 220 which are made of a nitride layer for example. The first side wall spacers 220 are used as an etching barrier in a post manufacturing process. Thereafter, a surface of the semiconductor substrate 210 is cleaned by using a method selected from a group consisting of RCA, UV/O3, dipping in fluoric acid (HF) or the combination thereof. Then, a single crystal silicon layer 222 is grown up on an exposed portion of the semiconductor device 210 by using a selective epitaxial growth.

The single crystal silicon layer 222 is achieved by using a low pressure chemical vapor (LPCVD) or an ultra high vacuum chemical vapor deposition (UHVCVD) method. In case of using the LPCVD method, to begin with, a hydrogen bake process is carried out at a temperature in the range of 800° C. to 900° C. for 1 to 5 minutes. Thereafter, the deposition is carried out on condition that fluxes of dichlorosilane (DCS) and HCl range from 30 sccm to 300 sccm and from 30 sccm to 200 sccm, respectively. And it is preferable that the LPCVD is performed at a temperature in the range of 750° C. to 950° C. and at a pressure in the range of 10 Torr to 100 Torr.

In addition, in case of using the UHVCVD method, it is preferable that the deposition is carried out using silane or disilane gas at a temperature in the range of 750° C. to 950° C. and at a pressure in the range of 10 Torr to 100 Torr. At this time, single crystal silicon doped with phosphine with 50–300 sccm is used as the single crystal silicon layer 224. By using the above method, impurities in the single crystal silicon layer 222 diffuse into the semiconductor substrate 210, thereby forming a shallow contact region 228 to a depth of 300 Å to 800 Å.

Figure 2C:
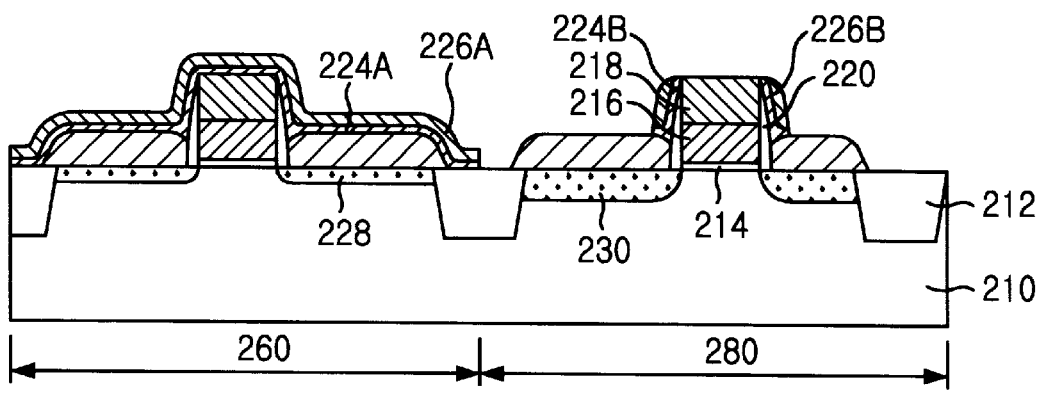

In an ensuing step, as shown in FIG. 2C, a second insulating layer and a third insulating layer are formed on the semiconductor substrate 210 and the gate structures, subsequently. And next, the second and the third insulating layers are patterned into a second predetermined configuration using a mask in the cell area 260, whereby a second patterned insulating layer 224A and a third patterned insulating layer 226A are formed in the cell area 260, and a second side wall spacer 224B and a third side wall spacer 226B are formed in the peripheral area 280. The third side wall spacer 226B is formed in order to make the depth of the diffusion region to be uniform in a following manufacturing step. The second insulating layer is formed to a thickness in the range of 100 Å to 200 Å using a nitride layer and the third insulating layer is formed to a thickness ranging from 300 Å to 500 Å using a thermal oxide layer. Thereafter, the impurity ions are implanted into the semiconductor substrate in the peripheral area 280, thereby obtaining a deep contact region 230.

If a contact region 230 is a p-type, the ion implantation is carried out using a dopant such as B or $BF_2$ with a dose amount of 1E15 ion/$cm^2$ to 1E17 ion/$cm^2$. At this time, it is preferable that an implantation energy of B ranges from 5 KeV to 50 KeV, and that of $BF_2$ ranges from 10 KeV to 100 KeV.

Moreover, if the contact region 230 is an n-type, the ion implantation is carried out using a dopant such as As or P with a dose amount of 1E15 ion/$cm^2$ to 1E17 ion/$cm^2$. At this time, it is preferable that an implantation energy of As ranges from 10 KeV to 100 KeV, and that of phosphorus (P) ranges from 10 KeV to 70 KeV.

Figure 2D:
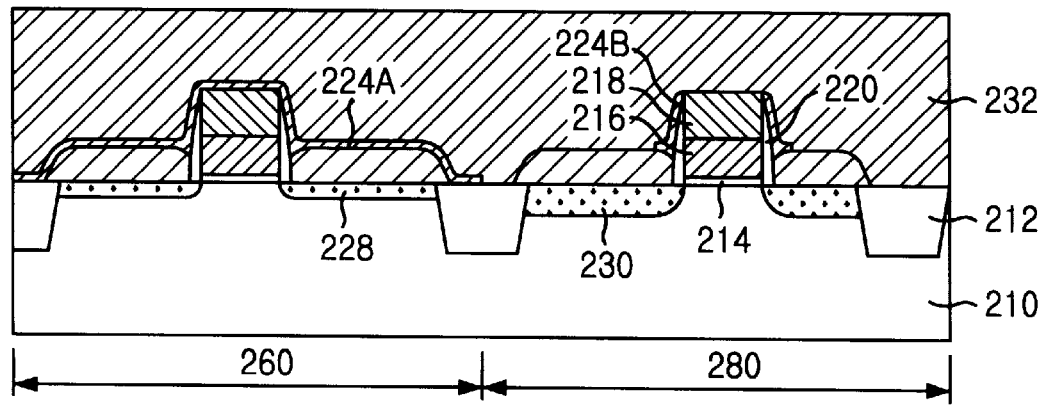

In a subsequent step, as shown in FIG. 2D, the third patterned insulating layer 226A and the third side wall spacer 226B are removed by a wet etching method using fluoric acid. Then, an interlayer insulating layer 232, e.g., made of BPSG, is formed to a thickness in the range of 4,000 Å to 8,000 Å on entire surface and flattened by using a chemical mechanical polishing (CMP) technique.

Figure 2E:
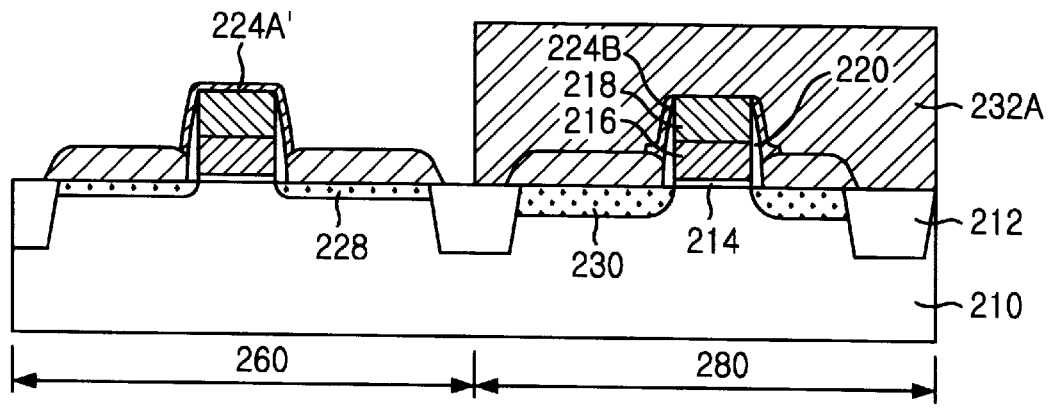

Thereafter, the interlayer insulating layer 232 is selectively etched into a third predetermined configuration using a mask, whereby the interlayer insulating layer 232 in the cell area 260 is removed and the second patterned insulating layer 224A is patterned into a side wall pattern 224A, as shown in FIG. 2E.

Figure 2F:
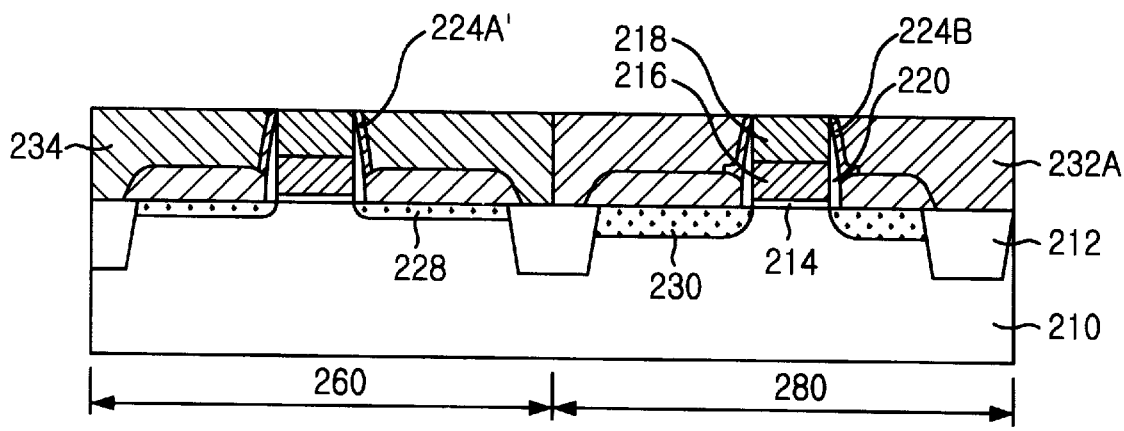

Finally, a conductive layer is deposited on entire surface and flattened by the CMP technique until a height of the conductive layer in the cell area 260 is identical to that of the interlayer insulating layer 232A in the peripheral area 280. Thus, a contact plug 234 is obtained, as shown in FIG. 2F.

In the present invention, by using the selective epitaxial growth of the single crystal silicon layer, it is possible to improve a contact margin in the cell area and further to obtain the deep contact region with a uniform depth in the peripheral region.

While the present invention has been described with respect to the particular embodiments, it will be apparent to those skilled in the art that various changes and modifications may be made without departing from the scope of the invention as defined in the following claims.

What is claimed is:

1. A method for manufacturing a semiconductor device, comprising the steps of:
   a) preparing a semiconductor substrate comprising cell and peripheral areas;
   b) forming a gate structure in each of the cell and peripheral areas, the gate structure comprising a gate dielectric, gate electrode and mask pattern;
   c) forming a first side wall spacer on each side of each gate structure in the cell and peripheral areas;
   d) growing a single crystal silicon layer on exposed portions of the semiconductor substrate by selective epitaxial growth;
   e) sequentially forming a first insulating layer and a second insulating layers over the first insulating layer at least covering partially the substrate and the gate structure to form;
   Sequentially forming a second side wall spacer covering exposed portions of each first side wall spacer in the peripheral area and a third side wall spacer covering each second side wall spacer;
   d) conducting ion implantation on the semiconductor substrate in the peripheral area;

e) removing the second insulating layer in the cell area and the third side wall spacer in the peripheral area;

f) forming an interlayer insulating layer over the cell and peripheral areas;

g) removing the interlayer insulating layer from the cell area, and the second insulating layer from the cell area except the top portion and first side walls of the gate structure in the cell area;

h) forming a conductive layer over the cell area; and i) planarizing the conductive layer to expose the gate structure in the cell area to form a contact plug in the cell area.

2. The method as recited in claim 1, wherein the first side wall spacer is formed to a thickness in the range of approximately 200 Å to approximately 500 Å.

3. The method as recited in claim 1, wherein the single crystal silicon layer is formed to a thickness ranging from 1,000 Å to 3,000 Å by doping phosphorous (P) with a dose amount of 5E18 ion/cm$^2$ to 5E19 ion/cm$^2$.

4. The method as recited in claim 1, wherein the single crystal silicon layer is formed by using a low pressure chemical vapor deposition (LPCVD) or an ultra high vacuum chemical vapor deposition (UHVCVD).

5. The method as recited in claim 4, wherein the low pressure chemical vapor deposition (LPCVD) is carried out for 3 minutes to 10 minutes using a mixed gas of dichlorosilane and HCl on condition at a pressure ranging from 10 Torr to 100 Torr and a temperature ranging from 750° C. to 950° C.

6. The method as recited in claim 5, wherein the low pressure chemical vapor deposition (LPCVD) is carried out using a flux of dichlorosilane and a flux of HCl ranging from approximately 30 sccm to approximately 300 sccm and approximately 30 sccm to approximately 200 sccm, respectively.

7. The method as recited in claim 4, wherein the ultra high vacuum chemical vapor deposition (UHVCVD) is carried out using a silane gas at a temperature ranging from 600° C. to 700° C. and at a pressure in the range of 0 to 1 Torr.

8. The method as recited in claim 1, wherein the first insulating layer has a thickness in the range of 100 Å to 200 Å using a nitride layer.

9. The method as recited in claim 1, wherein the second insulating layer has a thickness in the range of 300 Å to 500 Å.

10. The method as recited in claim 1, wherein the step of conducting ion implantation includes using boron (B) as a dopant with a dose amount of 1E15 ion/cm$^2$ to 1E17 ion/cm$^2$ and an implantation energy ranging from 5 KeV to 50 KeV providing that the contact region is a p-type.

11. The method as recited in claim 1, wherein the step of conducting ion implantation includes using $BF_2$ as the dopant with a dose amount of 1E15 ion/cm$^2$ to 1E17 ion/cm$^2$ and the implantation energy ranging from 10 KeV to 100 KeV providing that the contact region is a p-type.

12. The method as recited in claim 1, wherein the step of conducting ion implantation includes using arsenic (As) as the dopant with a dose amount of 1E15 ion/cm$^2$ to 1E17 ion/cm$^2$ and the implantation energy ranging from 10 KeV to 100 KeV providing that the contact region is an n-type.

13. The method as recited in claim 1, wherein the step of conducting ion implantation includes using phosphorus (P) as the dopant with a dose amount of 1E15 ion/cm$^2$ to 1E17 ion/cm$^2$ and the implantation energy ranging from 10 KeV to 70 KeV providing that the contact region is an n-type.

14. The method as recited in claim 1, wherein a contact region in the cell area is formed to a depth in the range of 300 Å to 800 Å by diffusion of impurity ions while growing the single crystal silicon layer.

15. The method as recited in claim 1, wherein the step of forming an interlayer insulating layer includes forming it to a thickness in the range of 4,000 Å to 8,000 Å using a boron-phophor-silicate-glass (BPSG).

16. The method as recited on claim 1, wherein the step of forming a conductive layer includes forming it to a thickness in the range of 3,000 Å to 7,000° C. using a P-doped single crystal silicon to a dose amount of 1E19 ion/cm$^2$ to 1E21 ion/cm$^2$.

17. The method as recited in claim 1, further comprising cleaning the semiconductor substrate using a RCA, UV/O3, dipping in fluoric acid (HF) or the combination thereof after forming the first side wall spacer.

18. The method as recited in claim 1, wherein the step of planarizing includes using chemical mechanical polishing (CMP).

19. The method as recited in claim 1, wherein the step of removing the third insulation layer includes using fluoric acid (HF).

* * * * *

UNITED STATES PATENT AND TRADEMARK OFFICE
CERTIFICATE OF CORRECTION

PATENT NO.    : 6,355,533 B2
DATED         : March 12, 2002
INVENTOR(S)   : Jung-Ho Lee It is certified that error appears in the above-identified patent and that said Letters Patent is hereby corrected as shown below:

Column 4,
Lines 58-59, "a second insulating layers" should read -- a second insulating layer --.

Column 6,
Line 30, "on claim 1" should read -- in claim 1 --.
Line 32, "7,000º C." should read -- 7,000 Å --.

Signed and Sealed this

Eighth Day of July, 2003

JAMES E. ROGAN
*Director of the United States Patent and Trademark Office*